(12) United States Patent
Unno et al.

(10) Patent No.: US 7,401,399 B2
(45) Date of Patent: Jul. 22, 2008

(54) METHOD OF MANUFACTURING A SUBSTRATE HEATING DEVICE

(75) Inventors: Yutaka Unno, Handa (JP); Yoshinobu Goto, Nagoya (JP); Taiji Kiku, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 324 days.

(21) Appl. No.: 11/059,576

(22) Filed: Feb. 16, 2005

(65) Prior Publication Data
US 2005/0210974 A1    Sep. 29, 2005

(30) Foreign Application Priority Data
Feb. 25, 2004    (JP)    ............... P2004-049699

(51) Int. Cl.
*H05B 3/00*    (2006.01)
(52) U.S. Cl. .................. 29/611; 29/592.1; 29/612; 29/613; 29/618; 29/619; 73/204.26; 219/443.1; 219/445.1; 219/448.11; 219/468.1
(58) Field of Classification Search .......... 29/611, 29/592.1, 612, 613, 618, 619; 73/204.26; 219/443.1, 445.1, 448.11, 468.1
See application file for complete search history.

(56) References Cited

U.S. PATENT DOCUMENTS 6,809,299 B2 * 10/2004 Hiramatsu et al. ....... 219/444.1
6,921,881 B2 *  7/2005 Ito et al. ................ 219/145.22

FOREIGN PATENT DOCUMENTS

JP    04-101381 A1    4/1992

\* cited by examiner

*Primary Examiner*—A. Dexter Tugbang
*Assistant Examiner*—Thiem Phan
(74) *Attorney, Agent, or Firm*—Burr & Brown (57) ABSTRACT

A manufacturing method for a substrate heating device comprises forming a base plate having a substrate heating surface in which a resistance heating element is buried, forming a tubular member, joining the tubular member to the base plate, measuring temperature distribution in the substrate heating surface by supplying power to the resistance heating element, and grinding the tubular member according to a grinding condition based on a measurement result of the temperature distribution.

21 Claims, 5 Drawing Sheets

To−Tc: 3.2°C
MAXIMUM TEMPERATURE DIFFERENCE ON X-AXIS: 2.8°C

FIG.4C

To−Tc: 1.8°C
MAXIMUM TEMPERATURE DIFFERENCE ON X-AXIS: 1.6°C

METHOD OF MANUFACTURING A SUBSTRATE HEATING DEVICE

CROSS REFERENCE TO RELATED APPLICATIONS

This application is based upon and claims the benefit of priority from prior Japanese Patent Application No.P2004-49699, filed on Feb. 25, 2004; the entire contents of which are incorporated herein by reference.

BACKGROUND OF THE INVENTION

1. Field of the Invention

The present invention relates to a substrate heating device, which heats a substrate such as a semiconductor wafer, a liquid crystal substrate or the like, and a manufacturing method for the same. More specifically, the present invention relates to a substrate heating device with a resistance heating element buried in a ceramic or metallic base plate, and a manufacturing method for the same.

2. Description of the Related Art

A heater with a resistance heating element buried in a ceramic or metallic base plate is widely used as a substrate heating device used for semiconductor manufacturing apparatus or the like. For example, a ceramic heater with a resistance heating element buried in a ceramic base plate made of high corrosion resistance ceramics; wherein the resistance heating element is not externally exposed. Therefore, a chemical vapor deposition (CVD) apparatus or a dry etching apparatus often using a corrosive gas may be used as the substrate heating device.

Furthermore, such a substrate heating device is often structured such that a tubular member is joined to the central undersurface of the ceramic base plate, and resistance heating element terminals and power supply members such as power supply rods connected thereto are housed in the tubular member so as to bring out the resistance heating element terminals without being exposed to a corrosive gas.

The ceramic heater used for semiconductor manufacturing apparatus is used over a wide range of temperatures from room temperature to a high temperature of 500° C. or greater depending on application thereof. Maintaining a uniform substrate temperature is desired for increasing yield of semiconductor products. Therefore, excellent temperature uniformity is desired for a surface on which the substrate is mounted of the substrate heating device, namely the substrate heating surface.

Meanwhile, with the ceramic heater equipped with a tubular member, which is joined to the ceramic base plate, since heat easily escapes from the tubular member through heat transfer, the temperature at the center of the substrate heating surface easily decreases to be lower than peripheral parts, in general.

Therefore, conventionally, adjustment of the helical pitch of the helical resistance heating element buried in the ceramic base plate, and adjustment of the shape and a position of the resistance heating element are performed for temperature uniformity in the substrate heating surface (Japanese Patent No. 2527836). Furthermore, adjustment of the shape and material of the tubular member is performed for temperature uniformity in the substrate heating surface.

However, conventionally, temperature uniformity evaluation of the substrate heating device is performed after the substrate heating device becomes possible to electrically connect and it is completed. Consequently, even if a certain degree of temperature uniformity is achieved with the above-mentioned conventional method of equalizing temperature, temperature variation due to slight differences in manufacturing conditions exists among production lots.

However, nowadays, the desired level of substrate temperature uniformity has risen; accordingly the level of substrate heating surface temperature uniformity has been rising. Correction of slight differences in temperature distribution based on the conventional design adjustments for resistance heating element or tubular member shape is not easy for achieving an extremely high level of temperature uniformity. Moreover, the temperature distribution in the substrate heating surface of the substrate heating device depends on working environment.

SUMMARY OF THE INVENTION

An object of the present invention is to provide a manufacturing method for a substrate heating device, which allows high accuracy adjustment of temperature distribution, such as correction of a slight difference in temperature distribution among production lots or correction of temperature distribution in accordance with the working environment, and a substrate heating device manufactured by the manufacturing method.

A manufacturing method for a substrate heating device according to an aspect of the present invention, comprises forming a base plate having a substrate heating surface in which a resistance heating element is buried, forming a tubular member, joining the tubular member to the base plate, measuring temperature distribution in the substrate heating surface by supplying power to the resistance heating element, and grinding the tubular member according to a grinding condition based on a measurement result of the temperature distribution.

According to the manufacturing method, grinding the tubular member based on the result of measuring the temperature distribution in the substrate heating surface under the same condition as the actual working condition allows adjustment of heat transfer from the tubular member and correction of the temperature distribution in the substrate heating surface. This allows more accurate adjustment of temperature distribution. Accordingly, slight variances in temperature distribution among production lots occurring due to differences in manufacturing conditions can be corrected, and temperature distribution can be corrected in accordance with the working environment.

A substrate heating device according to an aspect of the present invention comprises a base plate having a substrate heating surface in which a resistance heating element is buried, and a tubular member joined to the base plate and ground to adjust heat transfer from the base plate.

According to the substrate heating device, the tubular member is ground, and due to that grinding, the heat transfer from the tubular member is adjusted. Therefore, the desired temperature distribution in the substrate heating surface can be provided with high accuracy.

DETAILED DESCRIPTION OF THE EMBODIMENTS

Figure 1A:
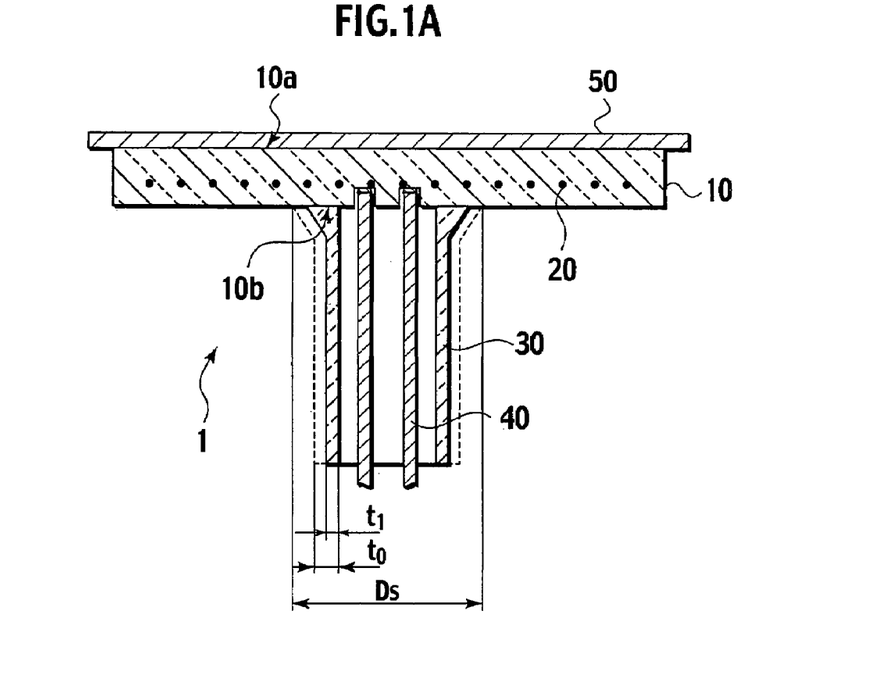
FIGS. 1A and 1B are a cross-sectional view taken along line 1a-1a and a plan view showing a structure of a substrate heating device according to an embodiment of the present invention.
Figure 1B:
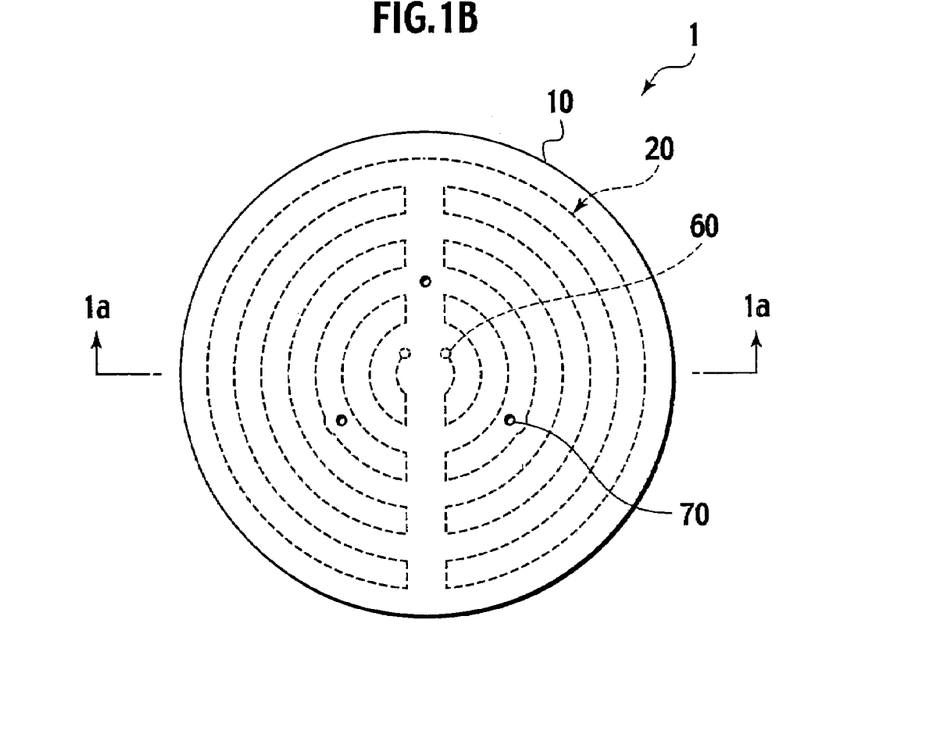

A cross-sectional view of a substrate heating device 1, according to an embodiment of the present invention, is shown in FIG. 1A, and a plan view of the substrate heating device 1 is shown in FIG. 1B. As shown in FIGS. 1A and 1B, the substrate heating device 1 includes a base plate 10, resistance heating element 20 buried in the base plate 10, a tubular member 30, power supply members 40, and resistance heating element terminals 60.

One side (surface) of the base plate 10 is the substrate heating surface 10a. A substrate 50 such as a semiconductor wafer or a glass substrate is mounted on this substrate heating surface 10a. The resistance heating element 20 receives power and generates heat so as to raise the temperature of the substrate heating surface 10a. The resistance heating element 20 may be made of a high melting point material such as molybdenum (Mo), tungsten (W), compound of tungsten with molybdenum, tungsten carbide (WC), or the like. A linear bulk, a coiled bulk, a strip-shaped bulk, sheet, or a thin film formed by physical vapor deposition or chemical vapor deposition may be used as the resistance heating element 20. Furthermore, the resistance heating element 20 may be formed by printing a printing paste including a high melting point material powder.

In addition, the pattern shape of the resistance heating element 20 is not limited. For example, the resistance heating element 20 is formed by symmetrically folding a linear bulk made of a high melting point material such that two resistance heating element terminals 60 are positioned in the center, as shown in FIG. 1B. Alternatively, the pattern shape of the resistance heating element 20 may be spiral, mesh or the like.

The tubular member 30 is joined to the base plate 10 at the center of the other side (the side opposite to the heating surface 10a) of the base plate 10, as shown in FIG. 1A. The power supply members 40, which provide power to the resistance heating element 20 are housed in inside the tubular part of the tubular member 30. Ends of the power supply members 40 are connected to the terminals of the resistance heating element 20 (resistance heating element terminals 60) through soldering or the like.

Figure 2:
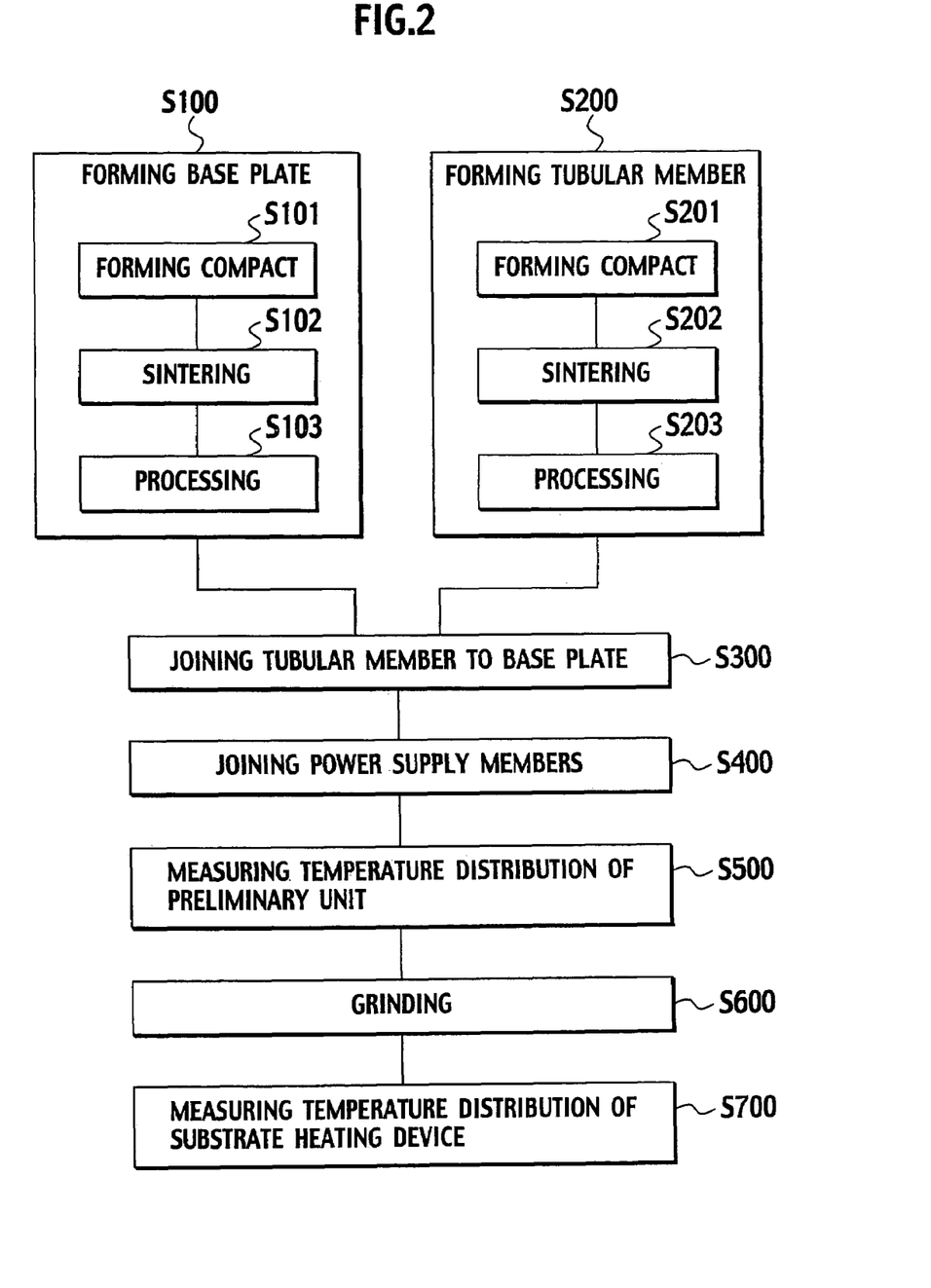
FIG. 2 is a flowchart showing a manufacturing method for the substrate heating device according to the embodiment of the present invention.

The substrate heating device 1 is obtained through a manufacturing method according to this embodiment shown in FIG. 2. More specifically, the substrate heating device 1 is manufactured by measuring the temperature distribution in the substrate heating surface 10a after the base plate 10 and the tubular member 30 are joined, and grinding the outer surface of the tubular member 30 so as to obtain a desired temperature distribution (e.g., uniform temperature distribution). In other words, as shown in FIG. 1A, the substrate heating device 1 obtained by grinding the tubular member 30 such that a thickness t0 of an initial tubular member 30 before grinding turns into a thickness t1. By this grinding, heat transfer from the base plate 10 to the tubular member 30 is adjusted.

Typically, since heat dissipates through heat transfer to the tubular member 30, the temperature at the central part of the substrate heating surface 10a in the substrate heating device 1, which includes the tubular member 30, tends to not rise. Therefore, a temperature distribution of the substrate heating surface 10a shows temperature of the central part of the substrate heating surface 10a is lower than temperature of surroundings. Heat dissipation from the tubular member 30 depends on the thickness thereof. It is particularly dependent on the cross-sectional area of the junction 10b of the tubular member 30 and the base plate 10. Accordingly, grinding an optimum amount of the outer surface of the tubular member 30 allows reduction in thickness of the tubular member 30 and prevention of excessive heat dissipation due to heat transfer to the tubular member 30. Thus, decline in temperature at the center of the substrate heating surface 10a can be prevented, and the required uniform temperature distribution in the substrate heating surface 10a can be obtained.

It is preferable that the substrate heating device 1 obtained by grinding has a relation, which is represented by Expression (1), between the base plate 10 and the tubular member 30, in the case where temperature uniformity in the substrate heating surface 10a is required. 'Ds' is an external diameter (mm) at a junction 10b of the base plate 10 and the tubular member 30. 't1' is a thickness (mm) of the tubular member 30 after grinding.

$$10 \leq Ds/t1 \leq 90 \qquad \text{Expression (1)}$$

Setting the ratio of the external diameter Ds of the junction 10b of the base plate 10 and the tubular member 30 and the thickness t1 of the tubular member 30 in the above-mentioned range may maintain mechanical strength of the tubular member 30 and obtain a uniform temperature distribution by restraining heat flowing from the base plate 10 to the tubular member 30.

More specifically, according to adjusting the ratio Ds/t1 of the external diameter Ds of the junction 10b and the thickness t1 of the tubular member 30 to equal to or less than about 90, thermal stress on the junction 10b can be kept low. In addition, the radial thickness of the tubular member 30 may also be maintained. Accordingly the tubular member 30 can maintain sufficient mechanical strength to hold the base plate 10. For example, the thermal stress on the junction 10b can be controlled to be equal to or less than about 20 Kgf/mm$^2$ in a wide working temperature range from about 50° C. to about 800° C.

Furthermore, according to adjusting the ratio Ds/t1 to equal to or greater than about 10, heat flowing from the base plate 10 to the tubular member 30 can be reduced. Accordingly, the substrate heating device 1 can provide a uniform temperature distribution. Particularly, satisfying Expression (1) is effective for a working temperature from about 50° C. to about 800° C.

The thickness t1 of the tubular member 30 refers to the thickness of the tubular member 30 in a region except for a junction region with the base plate 10, which is a part locally having a thick. The junction region denotes the junction 10b and its periphery. More specifically, the thickness t1 of the tubular member 30 means the thickness t1 in a vertical cross-ssection at the central axis of the tubular part except for the junction 10b with the base plate 10 and its periphery. As shown in FIG. 1A, the external diameter of the tubular member 30 is often wider at the junction 10b. Meanwhile, the internal diameter of the tubular member 30 is often fixed.

Therefore, the thickness of the tubular member 30 is locally thicker at the junction region. The thickness t1 refers to the thickness of the tubular member 30 except for a region locally thick at such junction region.

It is further preferable to satisfy Expression (2) given below, and is even further preferable to satisfy Expression (3).

$$15 \leq Ds/t1 \leq 80 \quad \text{Expression (2)}$$

$$20 \leq Ds/t1 \leq 60 \quad \text{Expression (3)}$$

Furthermore, it is preferable that the thickness t1 of the tubular member 30 is equal to or greater than about 0.5 mm. It can maintain strength of the tubular part of the tubular member 30.

A grinding process is carried out to provide a desired temperature distribution by grinding the outer surface of the tubular member 30 so as to restrain heat flowing due to heat transfer from the base plate 10 to the tubular member 30 by decreasing the cross-sectional area thereof. The tubular member 30 can be ground such that the thickness t1 of the tubular member 30 is substantially even. Or the tubular member 30 can be ground such that the thickness t1 of the tubular member 30 is uneven. Namely, the thickness t1 of the tubular member 30 may be adjusted to be substantially even or be different by location through grinding.

In order to maintain great mechanical strength of the tubular member 30, it is preferable to grind the tubular member 30 such that the thickness t1 is uniform by location. When the thickness t1 of the tubular member 30 is substantially even by location, generation of stress concentration can be restrained and mechanical strength can be maintained.

Meanwhile, adjusting such that the thickness t1 of the tubular member 30 is different by location allows more accurate adjustment of the temperature distribution. For example, partial deep grinding of the tubular part of the tubular member 30 may be carried out. Alternatively, when grinding the tubular member 30 with rotating the tubular part may be carried out, only specific places of the tubular member 30 can be ground through eccentric process which by shifting the rotational central axis away from the central axis of the tubular member 30. This allows more accurate adjustment of heat transfer amount.

Material of the base plate 10 in the substrate heating device 1 is not particularly limited; however, ceramics or a metal may be used. The base plate 10 can include at least one of alumina, aluminum nitride, silicon nitride, silicon carbide and sialon. For example, the base plate 10 can be made of alumina, aluminum nitride, silicon nitride, silicon carbide, sialon or the like. Or the base plate 10 can be made of ceramic composite of at least two ceramics selected from the group consisting of alumina, aluminum nitride, silicon nitride, silicon carbide and sialon. In this manner, when the base plate 10 is made of ceramics, the substrate heating device 1 including base plate 10 having a high heat resistant and high corrosion resistance can be provided. Particularly since aluminum nitride has high thermal conductivity, the substrate heating surface 10a also has excellent thermal conductivity, and provides heat uniformity. Furthermore, for example the base plate 10 can be made of aluminum, aluminum alloy, stainless steel or the like.

The material of the tubular member 30 is not particularly limited; however, it is preferable that the tubular member 30 is made of the same material as the base plate 10. Accordingly, generation of thermal stress due to difference in thermal expansion coefficient at the junction 10b of the base plate 10 and the tubular member 30 may be prevented, obtaining excellent junction state. Aluminum nitride, silicon carbide, alumina or the like can be preferably used.

Next, a manufacturing method for the substrate heating device 1, according to this embodiment, is described with reference to the flowchart of FIG. 2. The description here takes the base plate 10 and the tubular member 30 made of ceramics as an example.

To begin with, a base plate 10 made of a ceramic sintered body and having one side as a substrate heating surface 10a, in which resistance heating element 20 is buried, is formed (S100). In parallel with the step (S100), a tubular member 30 made of a ceramic sintered body is formed (S200). The tubular member 30 is then joined to the other side of the base plate 10 (S300). Resistance heating element terminals 60 and power supply members 40 are joined (S400). As a result, a preliminary unit allowing power supply to the resistance heating element 20 can be obtained.

Temperature distribution in the substrate heating surface 10a of this preliminary unit is measured (S500). In other words, the temperature distribution in the substrate heating surface 10a is measured by supplying power to the resistance heating element 20. When temperature uniformity of the substrate heating surface 10a is required, for example, temperature uniformity is evaluated. Based on measurement result of this temperature distribution, a grinding condition of the tubular member 30 is determined. For example, a grinding amount (thickness) of the tubular member 30, grinding area of the tubular member 30, or the like is determined. The tubular member 30 is ground according to the grinding condition (S600). Namely, the outer surface of the tubular member 30 is ground according to the grinding condition based on the measurement result of the temperature distribution. Temperature distribution of a substrate heating surface 10a in a completed substrate heating device 1 obtained by grinding is measured for confirmation (S700).

In other words, first, a preliminary unit capable of heating a substrate is formed. Next, temperature distribution in the substrate heating surface 10a of the preliminary unit is measured, and a grinding process is performed for the outer surface of the tubular member 30 based on the measurement result of the temperature distribution in order to correct the temperature distribution in the substrate heating surface 10a. Accordingly, fine adjustment of temperature distribution and correction of differences in temperature distribution per production lots due to a variety of manufacturing conditions can be achieved.

Required temperature distribution in the substrate heating surface 10a of the completed substrate heating device 1 depends on its working condition; however, when excellent temperature uniformity in the substrate heating surface 10a is required, it is preferable to determine the shape and material of the base plate 10, design of the resistance heating element 20, and the shape and material of the tubular member 30 such that sufficient temperature uniformity is provided even in a preliminary unit before grinding.

For example, it is preferable that temperature difference between (To−Tc) of the preliminary unit and $T_{(To-Tc)(target)}$ of the completed substrate heating device 1 is in a range from about 0° C. to about 10° C. (To−Tc) of the preliminary unit is temperature difference between temperature Tc at the central part and temperature To at the periphery of the substrate heating surface 10a in the preliminary unit. $T_{(To-Tc)(target)}$ is final target temperature difference, which is difference (To−Tc) between temperature Tc at the central part and temperature To at the periphery of the substrate heating surface 10a in the completed substrate heating device 1. Keeping the temperature difference between (To−Tc) of the preliminary unit and $T_{(To-Tc)(target)}$ to equal to or less than about 10° C. allows reduction load of grinding process for the tubular member 30 in order to restrain heat radiation due to heat transfer from the base plate 10 to the tubular member 30. It is further preferable that the temperature difference between (To–Tc) of the preliminary unit and $T_{(To-Tc)(target)}$ is in a range from about 0° C. to about 5° C.

It is preferable that the tubular member 30 is ground such that the base plate and the tubular member have a relation of Expression (1). Namely, the external diameter Ds at the junction 10b with the base plate 10 and the thickness t1 of the tubular member 30 is preferred to have a relation of Expression (1) at the stage of the completed substrate heating device 1 after grinding.

$$10 \leq Ds/t1 \leq 90 \quad \text{Expression (1)}$$

(Ds: an external diameter (mm) at a junction 10b of base plate 10 and tubular member 30,
t1: a thickness (mm) of the tubular member 30 after grinding except for a junction region with the base plate 10)

Setting the ratio of the external diameter Ds of the junction 10b of the base plate 10 and the tubular member 30 and the thickness t1 of the tubular member 30 in the above-mentioned range may maintain mechanical strength of the tubular member 30 and obtain a uniform temperature distribution by restraining heat flowing from the base plate 10 to the tubular member 30.

More specifically, keeping ratio Ds/t1 of the external diameter Ds of the junction 10b of the base plate 10 and the tubular member 30 and the thickness t1 of the tubular member 30 to equal to or less than about 90 can keep thermal stress on the junction 10b low. In addition, the radial thickness of the tubular member 30 may also be maintained. Sufficient mechanical strength can accordingly be maintained such that the tubular member 30 can hold the base plate 10. For example, the thermal stress on the junction 10b can be controlled to be equal or less than about 20 Kgf/mm² in a wide working temperature range from about 50° C. to about 800° C.

Furthermore, according to adjusting the ratio Ds/t1 to equal to or greater than about 10, heat flowing from the base plate 10 to the tubular member 30 can be reduced. Accordingly, the substrate heating device 1 can provide a uniform temperature distribution.

It is further preferable to satisfy Expression (2) given below, and is even further preferable to satisfy Expression (3).

$$15 \leq Ds/t1 \leq 80 \quad \text{Expression (2)}$$

$$20 \leq Ds/t1 \leq 60 \quad \text{Expression (3)}$$

Temperature uniformity of the preliminary unit may be evaluated by temperature distribution evaluation using an infrared thermometer or the like as indicated in working examples described later.

The greater the temperature difference (To–Tc) of the preliminary unit between temperature Tc at the central part and temperature To at the periphery of the substrate heating surface 10a of the preliminary unit, and the final target temperature difference $T_{(To-Tc)(target)}$ between temperature Tc and temperature To of the completed substrate heating device 1, the more grinding amount of the tubular member 30 needs.

In the case where temperature uniformity of the substrate heating surface 10a is required, it is preferable that a grinding condition (grinding amount) is determined such that a temperature variation in the substrate heating surface 10a decreases based on the measurement result of the temperature distribution (temperature uniformity evaluation result).

The grinding condition, which is a grinding amount (ground thickness of the tubular member 30) can be determined by preparing in advance data such as a calibration card obtained from relations between temperature difference (To–Tc) in the substrate heating surface 10a and the thickness t of the tubular member 30 using a finished product sample, and calculating the thickness t by using temperature difference (To–Tc) of the substrate heating surface 10a obtained from the measurement result of the temperature distribution of the preliminary unit.

Alternatively, the step of grinding the tubular member 30 (S600) and the step of measuring temperature distribution (S500) may be repeated multiple times. Furthermore, the grinding condition (grinding amount) may be determined from the relation between a grinding amount and temperature distribution change based on the measurement result of the temperature distribution after each grinding step. More specifically, once the temperature of the preliminary unit is measured, the tubular member 30 is ground a small amount at a time, after each grinding step, temperature distribution is measured, and a final grinding amount may be determined from the data of these multiple times. For example, an operation of determining the next grinding amount from the relation between a grinding amount and temperature distribution change may be repeated. In this case, a necessary grinding amount can be determined based on data for each product. Therefore, a unique condition for each product can be reflected to determine an accurate grinding amount.

In other words, the tubular member 30 can be ground by a plurality of grinding steps. And the temperature distribution in the substrate heating surface 10a can be measured after each grinding step. Then, the grinding condition (grinding amount) can be determined from a relation between a grinding amount and temperature distribution change based on the measurement result of the temperature distribution. A grinding amount and temperature distribution change due to grinding vary from product to product. According to this method, since a grinding amount may be determined from the relation between a grinding amount and the temperature distribution change for each product, accurate temperature adjustment is possible for each product.

The outer surface of the tubular member 30 may be ground substantially evenly. Furthermore, a part of the outer surface of the tubular member 30 may be ground unevenly. In the case of evenly grinding the outer surface, generation of stress concentration due to the variance in grinding amount can be controlled. For example, when the preliminary unit has a nearly concentric temperature distribution where the temperature at the central part of the base plate 10 joined to the tubular member 30 is low, temperature uniformity in the base plate 10 can be achieved by evenly grinding the entire tubular member 30. Evenly grinding the outer surface of the tubular member 30 in this manner allows prevention of occurrence of stress concentration in locally thin parts if exist, which may cause the tubular member 30 to be easily damaged, and thereby maintaining mechanical strength of the tubular member 30.

On the other hand, in the case of uneven grinding, adjustment of the temperature distribution can be carried out with even more accurate. For example, in the case of grinding the outer surface of the tubular member 30 while rotating it, eccentric process by shifting the rotational axis allows grinding of only a part of the outer surface of the tubular member 30. Accordingly, decreasing temperature of an area in the base plate 10 corresponding to the ground area can be restrained so as to achieve temperature uniformity in the substrate heating surface 10a. In this manner, unevenly grinding part of the tubular member 30 based on the required temperature condition allows the temperature distribution in the substrate heating surface 10a to become a required temperature distribution.

Furthermore, in the case of manufacturing the tubular member with a ceramic material, it is preferable that the thickness of the tubular member 30 after grinding is equal to or greater than about 0.5 mm even at the thinnest part. Accordingly, the tubular member 30 may maintain sufficient strength. The thickness of the tubular member is preferably equal to or more than about 1 mm. Furthermore, difference (t0−t1) between a thickness t0 of a tubular member 30 before grinding and a thickness t1 of the tubular member 30 after grinding, namely the grinding amount is preferably equal to or less than about 4 mm. It is further preferably equal to or less than about 2 mm. Making the grinding amount be equal to or less than about 4 mm allows a shortened grinding time and reduction in process load.

In other words, the tubular member 30 can be ground such that the thickness t0 of the tubular member 30 before grinding and the thickness t1 of the tubular member 30 after grinding preferably have a relation of the following Expression (4).

$$t0-t1 \leq 4 \text{ mm and } t1 \geq 0.5 \text{ mm} \quad \text{Expression (4)}$$

Furthermore, the temperature distribution in the substrate heating surface 10a ultimately obtained is not limited to a distribution where there is substantially no temperature difference between the central part of the substrate heating surface 10a and the periphery of the substrate heating surface 10a. In other words, final target temperature difference $T_{(To-Tc)(target)}$ of the substrate heating device 1 is not always 0° C. Temperature distribution (final target temperature difference $T_{(To-Tc)(target)}$) in the substrate heating surface 10a is determined in accordance with applications and working environment of the substrate heating device 1. Accordingly, for example, a predetermined temperature distribution having specific temperature difference may be set.

Next, each step of the manufacturing method for the substrate heating device 1 is described in detail. To begin with, in the base plate 10 forming step (S100), a ceramic compact for the base plate 10 in which the resistance heating element 20 is buried is formed (S101). The ceramic compact is then sintered (S102), and the ceramic sintered body for the base plate 10 is processed (S103).

A ceramic raw powder is made by adding a rare-earth oxide such as $Y_2O_3$ as a sintering aid, to a main material such as AlN, SiC, SiNx, sialon or the like. Furthermore, in the forming step of the ceramic compact for the base plate 10, for example, a preform may be formed by filling the ceramic raw powder in a mold and pressing, the resistance heating element 20 may be put on the preform, and the ceramic raw powder may be filled from above the perform and the resistance heating element 20 and then pressed. A channel may be formed in the preform at the position of the resistance heating element 20 in advance. In this manner, the ceramic compact for the base plate 10 in which the resistance heating element 20 is buried as shown in FIG. 3A is formed.

Figure 3A:
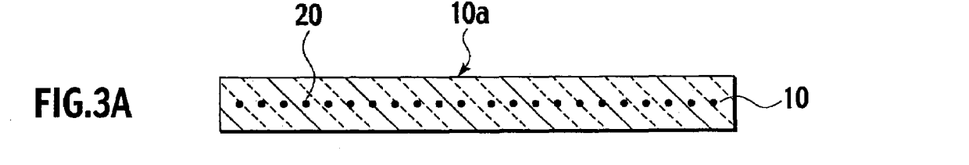
FIGS. 3A to 3D are cross-sectional views of a base plate according to the embodiment of the present invention.
Figure 3B:
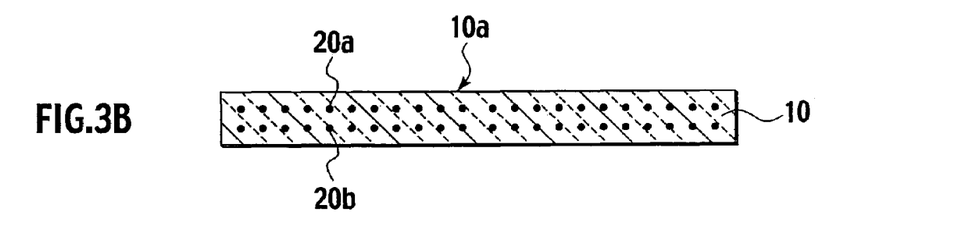

A layer of resistance heating element 20 may be buried in a plane approximately parallel to the substrate heating surface 10a as shown in FIG. 3A. Or multiple layers of multiple resistance heating element 20a, 20b may be buried in multiple planes approximately parallel to the substrate heating surface 10a as shown in FIG. 3B. When burying multiple resistance heating elements in layers, the steps of positioning resistance heating element, filling in ceramic raw powder, and pressing can be repeated.

Figure 3C:
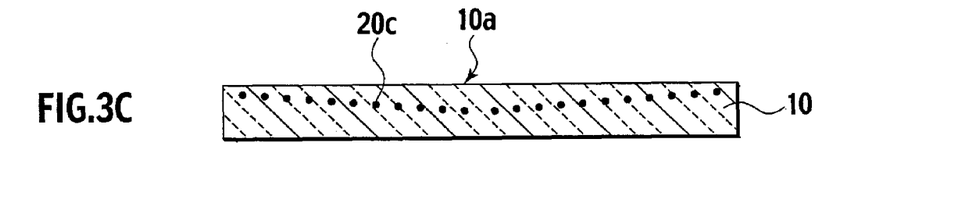
Figure 3D:
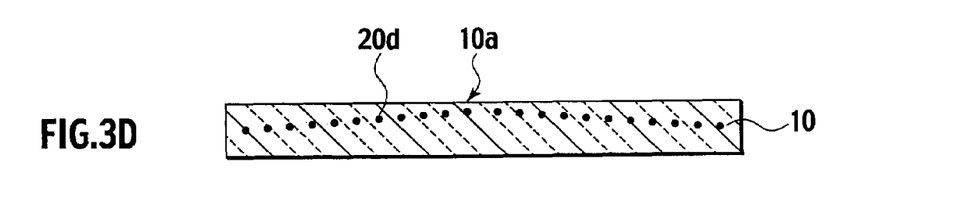

In addition, buried positions of the resistance heating element are not limited to planes parallel to the substrate heating surface 10a. For example, as shown in FIG. 3C, resistance heating element 20c may be buried such that the central of the resistance heating element 20c can be far from the substrate heating surface 10a and the periphery of the resistance heating element 20c can be close to the substrate heating surface 10a (resulting in an inverse tapered-shape relative to the substrate heating surface 10a.) Alternatively, as shown in FIG. 3D, the resistance heating element 20d may be buried such that the central of the resistance heating element 20d can be close to the substrate heating surface 10a and the periphery of the resistance heating element 20d can be far from the substrate heating surface 10a (resulting in a tapered-shape relative to the substrate heating surface 10a.).

In the sintering step of the ceramic compact for the base plate 10 (S102), the ceramic compact sintered by hot pressing method or atmospheric sintering method, for example. In the case of using an aluminum nitride powder as the ceramic raw powder, it is sintered for about 1 to about 10 hours at a temperature of about 1700° C. to about 2000° C. in a nitrogen atmosphere. Pressure of hot pressing is from about 20 kg/cm² to about 100 kg/cm², more preferably about 100 kg/cm² to about 400 kg/cm². Since pressure is applied in a uniaxial direction when sintering by using the hot pressing method, excellent adhesiveness of the resistance heating element 20 and the surrounding ceramic base plate 10 is possible. Furthermore, when using a metallic bulk as the resistance heating element 20, there is no deformation with the applied pressure when sintering by the hot pressing method.

In the processing step of the ceramic base plate 10 (S103), once the center of the resistance heating element is identified using radiography, chamfering corners and drilling holes for inserting resistance heating element terminals 60 in the sintered ceramic base plate 10 are performed. Furthermore, the surface of the ceramic base plate 10 is embossed, a concave portion is formed for positioning the substrate, or holes or channels, which are for purge gas to flow to the substrate heating surface 10a, or lift pin holes 70 for lifting the substrate as shown in FIG. 1B are formed as required.

Instead of the process after sintering is completed, a preliminary sintered body for base plate 10 may be processed. The preliminary sintered body can be obtained by sintering at a slightly lower temperature than the final sintering temperature, by sintering for a short period. Processing before sintering is completely finished facilitates processing. When processing a preliminary sintered body, re-sintering is performed thereafter.

Meanwhile, in the tubular member forming step (S200), to begin with, a ceramic compact for a tubular member 30 is formed with a ceramic raw powder (S201). The ceramic compact is then sintered (S202), and the sintered body for tubular member 30 is processed (S203).

In the forming step of the ceramic compact for the tubular member 30 (S201), using a ceramic raw powder made of the same material as the ceramic base plate 10 is preferred so as to achieve an excellent junction with the ceramic base plate. There are various forming methods; however, it is preferable to use a cold isostatic pressing (CIP) method or a slip cast method, which is suitable for shaping of a comparatively complicated shape.

In the sintering step of the ceramic compact for the tubular member 30 (S202), it is preferable to sinter by atmospheric sintering method since the shape of the ceramic compact is complicated. In the case of using AlN as the ceramic raw material, it is sintered for about 1 to about 10 hours at a temperature of about 1700° C. to about 2000° C. in a nitrogen atmosphere. In the processing step of the sintered body for the tubular member 30 (S203), the sintered body surfaces such as the outer surface, the inner surface and the joint surface are lapped.

Next, the ceramic base plate 10 and the ceramic tubular member 30 obtained through the above-mentioned methods are joined (S300). In this joining step (S300), a binder such as a rare-earth oxide or the like is applied to at least one of the joint surface of the ceramic base plate 10 and the joint surface of the ceramic tubular member 30. Then, the joint surfaces are bonded together, and a heat treatment is performed at a temperature of about 1700° C. to about 1900° C. in a nitrogen atmosphere. Predetermined pressure may be applied in a uniaxial direction to the joint surfaces as required. This allows solid-state bonding of the ceramic base plate 10 and the ceramic tubular member 30. The base plate 10 and the tubular member 30 may be mechanically bonded by soldering or putting a seal member such as an O-ring or metallic packing therebetween.

Furthermore, the power supply members 40 are inserted in the tubular member 30, and the resistance heating element terminals 60 and the power supply members 40 inserted in the tubular member 30 are joined together (S400). The power supply members 40 may be made of a conductive material such as Ni processed into a rod shape or wire shape. The power supply members 40 and the resistance heating element terminals 60 may be joined by soldering. Furthermore, The power supply members 40 and the resistance heating element terminals 60 may be joined by thread cutting in the circumferences of the rod-shaped power supply members 40, thread cutting in the resistance heating element terminals 60, and screwing ends of the power supply members 40 into the resistance heating element terminals 60. Alternatively, caulking, setting in, welding, or solid-state bonding using eutectic crystals may be employed. In this manner, the power supply members 40 housed in the tubular member 30 can be joined to the resistance heating element 20 through the resistance heating element terminals 60, after joining the tubular member 30 (S300) and before measuring the temperature distribution (S500).

In this manner, a preliminary unit is obtained by joining the resistance heating element terminals 60 and the power supply members 40. Power is then supplied to the resistance heating element 20 in the preliminary unit so that the resistance heating element 20 generates heat. Temperature distribution in the substrate heating surface 10a of the base plate 10 is measured using an infrared radiometer or the like under actual working conditions (S500).

The grinding condition (e.g., grinding amount) for the tubular member 30 is determined from the measurement result of the temperature distribution by using the above-mentioned method or the like. For example, when temperature uniformity in the substrate heating surface 10a is required, a necessary grinding amount for improving temperature uniformity is determined by using the calibration card or the like prepared ahead of time. Alternatively, the subsequent step of grinding the tubular member 30 and evaluating the temperature distribution in the substrate heating surface 10a is repeatedly executed multiple times, an optimum grinding amount for each product is determined, and a grinding process is performed (S600). After the grinding step (S600), temperature distribution is re-measured in order to confirm a final temperature distribution in the substrate heating surface 10a of the substrate heating device 1 (S700). Thus, the completed substrate heating device 1 can be obtained.

As described above, according to the manufacturing method for the substrate heating device 1, heat transfer from the base plate 10 to the tubular member 30 is adjusted so as to correct the temperature distribution in the substrate heating surface 10a by grinding the outer surface of the tubular member 30 based on the result of measuring temperature distribution in the substrate heating surface 10a under the same conditions as the actual working conditions. This allows more accurate adjustment of the temperature distribution. Furthermore, in the substrate heating device 1, the outer surface of the tubular member 30 is ground and adjusted heat transfer from the base plate 10 to the tubular member 30. Therefore, the desired, highly accurate temperature distribution in the substrate heating surface 10a can be obtained. Accordingly, slight variances of the temperature distribution among production lots occurring, for example, due to differing manufacturing conditions can be corrected. Therefore, stabilizing quality of product can be achieved.

In addition, due to the accurate adjustment of the temperature distribution, excellent temperature uniformity in the substrate heating surface 10a may be obtained, and a predetermined temperature distribution may be set in accordance with the working environment. Accordingly, the desire to control the variance in temperature for a large diameter substrate, for example, a substrate having 200 to 300 mm diameter to be in the range from about 0° C. to about 2° C. may be responded. Furthermore, the substrate heating device 1 being used in the wide temperature range, for example, from room temperature to exceeding about 500° C. can be provided.

Moreover, this allows slight correction of temperature distribution in accordance with the working environment (working conditions) after forming the preliminary unit. Namely, slight correction of temperature distribution can be performed in an almost finished product. Therefore, the substrate heating device 1 having a temperature distribution suitable for various working conditions can be provided. Furthermore, adjustment by grinding the tubular member 30 does not impair product appearance.

Although the inventions have been described above by reference to certain embodiments of the inventions, the inventions are not limited to the embodiments described above. Modifications and variations of the embodiments described above will occur to those skilled in the art, in light of the above teachings.

For example, with the above-mentioned embodiment, examples are described where the base plate 10 and the tubular member 30 are formed of ceramics; however, the materials thereof are not limited to ceramics, and a metallic material such as aluminum may be used. In this case, the base plate 10 and the tubular member 30 may be formed through grinding and pressing. When applied in an environment in which a corrosive gas is used, formation of an oxide layer or the like on the surface of a metallic base plate is preferred.

Furthermore, the substrate heating device may have electrostatic chuck electrodes buried therein in addition to the resistance heating element 20. According to this, an electrostatic chuck function may be added to the substrate heating device.

Moreover, in FIG. 2, after the step of joining the tubular member 30 (S300), and before the step of measuring temperature distribution (S500), there is a step of joining the power supply members 40 to the resistance heating element 20 through the resistance heating element terminals 60; however, the joining step for the power supply members 40 may be carried out after grinding (S600) or temperature distribution measurement after grinding (S700). In this case, temperature distribution measurement for the preliminary unit may be performed by connecting temporary power supply members to the resistance heating element 20 through the resistance heating element terminals 60. Furthermore, in the step of grinding the tubular member 30, the inner surface or end surface of the tubular member 30 can be ground. In other word, at least one of the outer surface, inner surface and end surface of the tubular member 30 can be ground.

EXAMPLES

First Working Example

The ceramic base plate 10 in which the resistance heating element 20 are buried is formed under the following conditions. An acrylic resin binder is added to a ceramic mixed powder, which is made by adding 5% by weight of $Y_2O_3$ to an AlN powder obtained through reductive nitridation, and granules are then generated through spray granulation. These granules are filled in a mold and pressed so as to form a preform. Next, a channel is formed at positions for the resistance heating element 20 of the preform to be buried by transcription. Linear Mo resistance heating element 20 0.5 mm in diameter processed in the shape shown in FIG. 1B is placed in the channel, the ceramic raw powder is filled thereupon, and the entirety is re-pressed in a uniaxial direction. The pressing pressure is 200 kg/cm². This forms the ceramic compact for the base plate 10 in which the resistance heating element 20 is buried.

The ceramic compact is sintered using a hot pressing method. Sintering conditions are to maintain 1860° C. for six hours in an atmosphere with a nitrogen gauge pressure of 0.5 kg/cm². The resulting sintered body has an external diameter of 330 mm and a thickness of 17 mm. Furthermore, the resistance heating element 20 is buried at a depth of 8.5 mm from the heating surface.

Lift pin holes 70 and purge gas holes are formed in the resulting sintered body. The surface of the ceramic base plate 10, which becomes the substance heating surface 10a, is planarized by a rotary surface grinder using diamond abrasive paper and a whetstone.

Meanwhile, the tubular member 30 is formed under the following conditions. An acrylic resin binder is added to a ceramic mixed powder, which is made by adding 5% by weight of $Y_2O_3$ to an AlN powder obtained through reductive nitridation, and granules are then generated through spray granulation. A ceramic compact is formed of these granules by CIP.

Next, the ceramic compact for the tubular member 30 is sintered through atmospheric sintering method. The sintering conditions maintaining a sintering temperature of 1850° C. for three hours in a nitrogen atmosphere. The external diameter of the junction 10b of the tubular member 30 after sintering is 70 mm, the external diameter of the tubular member 30 in the middle of the axis is 37 mm with thickness t0 of 4.0 mm, and the length of the tubular member 30 is 180 mm.

The sintered body surfaces of the tubular member 30 such as the outer surface, the inner surface and the joint surface to the base plate 10 are lapped. An yttrium nitrate solution with an yttrium concentration of $2.6 \times 10^{-6}$ mol/cc is applied to respective joint surfaces of the ceramic base plate 10 and the tubular member 30, and both surfaces are bonded together and undergo a heat treatment at 1800° C. for two hours in a nitrogen atmosphere so as to join the tubular member 30 to the central part of the base plate underside.

Afterwards, a preliminary unit is obtained by joining the rod-shaped power supply members 40 made of Ni to the resistance heating element terminals 60 of the resistance heating element 20, which are buried in the ceramic base plate 10, by soldering.

Figure 4A:
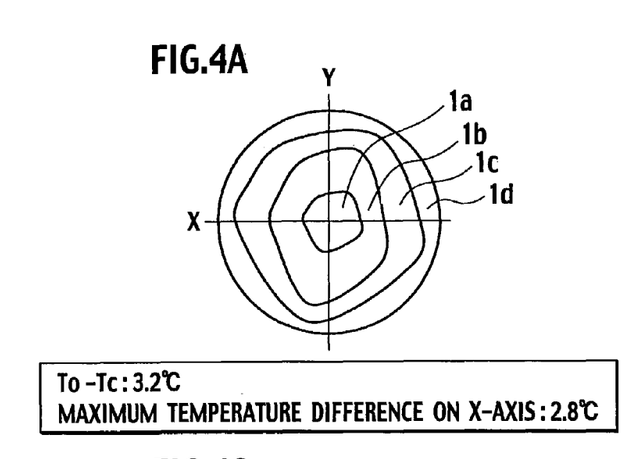
FIGS. 4A to 4D are graphs showing temperature distribution in a substrate heating surface of a preliminary unit and temperature distribution in the substrate heating surface after grinding, according to a first working example of the present invention.
Figure 4B:
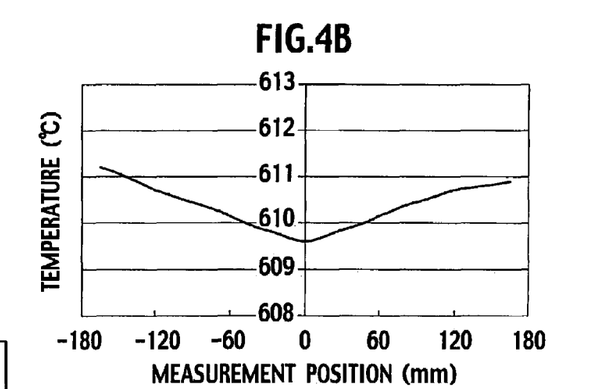
Figure 4C:
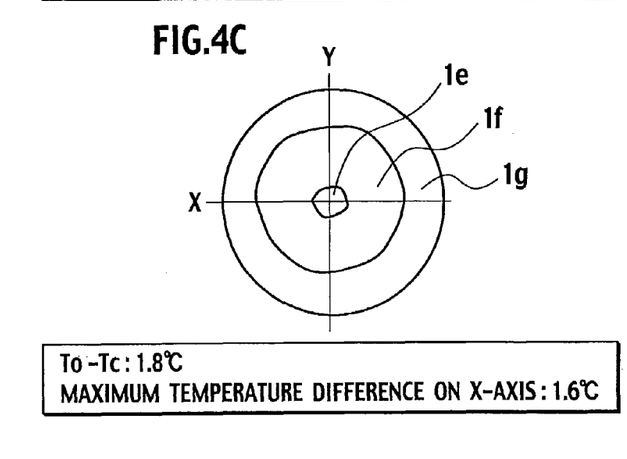
Figure 4D:
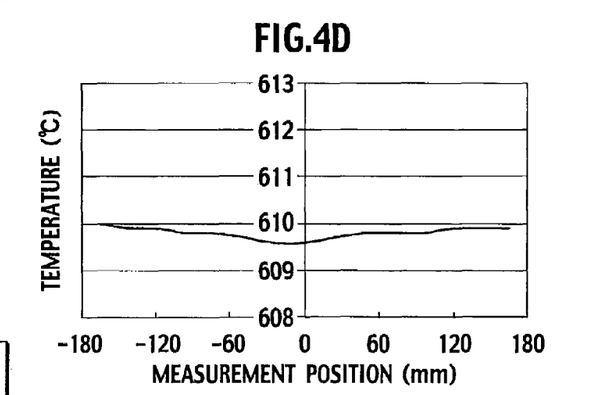

The temperature distribution of the substrate heating surface 10a is measured by setting the temperature thereof to approximately 610° C. and supplying power to the resistance heating element 20 of the preliminary unit. Measurement results of the temperature distribution are given in FIGS. 4A and 4B. FIGS. 4A and 4C are isothermal distribution graphs schematically representing the temperature distribution in the substrate heating surface 10a. FIGS. 4B and 4D are graphs representing the temperature distribution in the substrate heating surface 10a relative to positions on the X-axis. In FIGS. 4B and 4D, the vertical axis represents temperature (° C.) and the horizontal axis represents measurement position (mm) on the X-axis.

As shown in FIGS. 4A and 4B, the substrate heating surface 10a has multiple regions 1a to 1d differing in temperature, namely variances in the temperature distribution. Furthermore, temperature Tc in the region 1a at the central part of the substrate heating surface 10a is lower than temperature To in the region 1d at the periphery, and difference (To–Tc) between temperature Tc and temperature To is approximately 3.2° C. The maximum temperature difference on the X-axis is approximately 2.8° C. It is nearly isothermal within the same region.

Next, a grinding condition (grinding amount) is determined based on the measurements result of the temperature distribution, and the outer surface of the tubular member 30 in the preliminary unit is ground. More specifically, the external diameter of the tubular member 30 is ground off 2 mm. In other words, the external diameter of the junction 10b of the tubular member 30 is ground from 70 mm down to 68 mm, and the external diameter in the middle of the axis is ground from 37 mm down to 35.8 mm. In addition, thickness t0 of the tubular member 30 before grinding 4 mm is ground off 0.6 mm such that the thickness t1 of the tubular member 30 after grinding is 3.4 mm.

After the tubular member 30 is ground, the temperature distribution of the substrate heating surface 10a is re-measured. Measurement results of the temperature distribution are given in FIGS. 4C and 4D. As shown in FIGS. 4C and 4D, the number of regions 1e to 1g differing in temperature can be reduced. The variances in the temperature distribution can be corrected. Furthermore, the difference (To–Tc) between temperature Tc in the region 1e at the central part of the substrate heating surface 10a and temperature To in the region 1g at the periphery is improved to be approximately 1.8° C. The maximum temperature difference on the X-axis is also improved to be approximately 1.6° C.

In this manner, the substrate heating device 1, which has excellent temperature uniformity with temperature variances of less than 2° C. at a high temperature exceeding approximately 600° C., can be provided by grinding the tubular member 30.

Second Working Example

A preliminary unit for the substrate heating device 1 made up of an aluminum nitride base plate 10 and the tubular member 30 is formed. The external diameter of the base plate 10 is 340 mm, and the thickness is 15 mm. Furthermore, as shown in FIG. 3B, two types of resistance heating element 20a, 20b are buried in the base plate 10 so as to be a two-layer structure parallel to the substrate heating surface 10a. The upper layer resistance heating element 20a is buried at a depth of 6.5 mm from the substrate heating surface 10a, and the lower layer resistance heating element 20b is buried at a depth of 12 mm from the substrate heating surface 10a. The external diameter of the junction 10b of the tubular member 30 obtained by sintering is 90 mm, the external diameter of the tubular member 30 in the middle of the axis is 58 mm with thickness t0 of 3.5 mm, and the length thereof is 220 mm. The manufacturing conditions other than those above are the same as in the first working example.

Figure 5A:
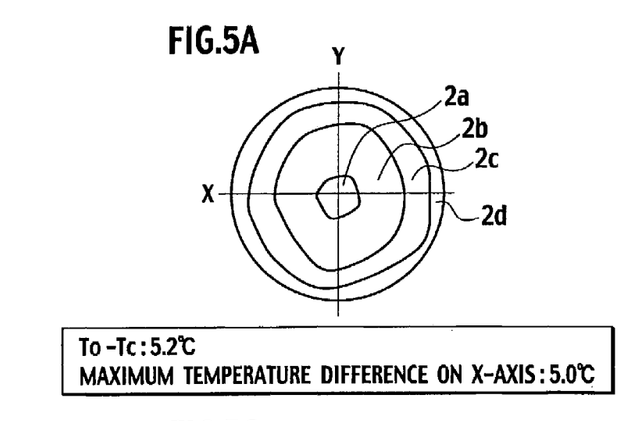
FIGS. 5A to 5D are graphs showing temperature distribution in a substrate heating surface of a preliminary unit and temperature distribution in the substrate heating surface after grinding, according to a second working example of the present invention.
Figure 5B:
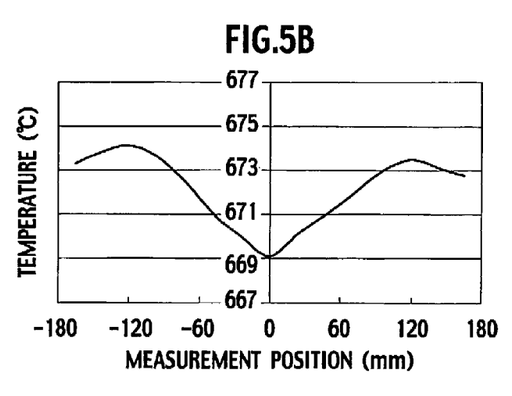

The temperature of the substrate heating surface 10a is set to approximately 610° C. and power is supplied to the resistance heating elements 21a, 21b of the preliminary unit. Temperature distribution in the substrate heating surface 10a is then measured. Measurement results of the temperature distribution are given in FIGS. 5A and 5B. As shown in FIGS. 5A and 5B, the substrate heating surface 10a has multiple regions 2a to 2d differing in temperature, namely variances in the temperature distribution. Furthermore, temperature Tc in the region 2a at the central part of the substrate heating surface 10a is lower than temperature To in the region 2d at the periphery, and difference (To−Tc) between temperature Tc and temperature To is approximately 5.2° C. The maximum temperature difference on the X-axis is approximately 5.0° C. It is nearly isothermal within the same region.

Next, a grinding condition (grinding amount) is determined based on the measurement results of the temperature distribution, and the outer surface of the tubular member 30 in the preliminary unit is ground. More specifically, the external diameter of the tubular member 30 is ground off 2 mm. In other words, the external diameter of the junction 10b of the tubular member 30 is ground from 90 mm down to 88 mm, and the external diameter in the middle of the axis is ground from 58 mm down to 56 mm. In addition, thickness t0 of the tubular member 30 before grinding 3.5 mm is ground off 1.0 mm such that the thickness t1 of the tubular member 30 after grinding is 2.5 mm.

Figure 5C:
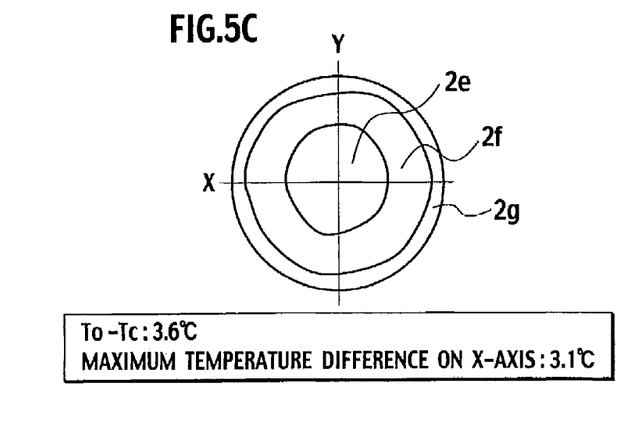
Figure 5D:
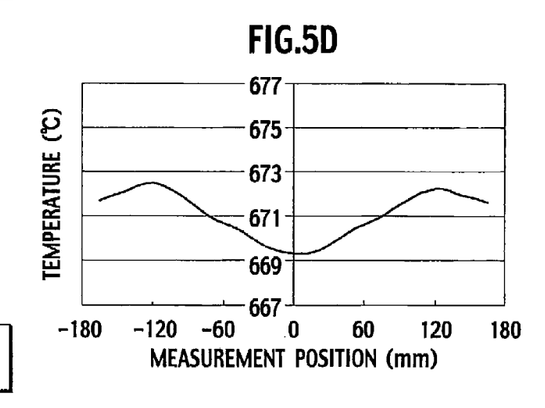

After the tubular member 30 is ground, the temperature distribution in the substrate heating surface 10a is re-measured. Measurement results of the temperature distribution are given in FIGS. 5C and 5D. As shown in FIGS. 5C and 5D, the number of regions 2e to 2g differing in temperature can be reduced. The variances in the temperature distribution can be corrected. Furthermore, the difference (To−Tc) between temperature Tc in the region 2e at the central part of the substrate heating surface 10a and temperature To in the region 2g at the periphery is improved to be approximately 3.6° C. The maximum temperature difference on the X-axis is also improved to be approximately 3.1° C.

In this manner, the substrate heating device 1, which has excellent temperature uniformity with little temperature variances at a high temperature exceeding approximately 600° C., can be obtained by grinding the tubular member 30 even when two levels of resistance heating elements 20a, 20b are buried.

What is claimed is:

1. A manufacturing method for a substrate heating device, comprising:
   forming a base plate having a substrate heating surface in which a resistance heating element is buried;
   forming a tubular member;
   joining the tubular member to the base plate;
   then joining a power supply member housed in the tubular member to the resistance heating element;
   then measuring temperature distribution in the substrate heating surface by supplying power to the resistance heating element;
   grinding the tubular member according to a grinding condition based on a measurement result of the temperature distribution;
   measuring the temperature distribution in the substrate heating surface again; and
   performing another grinding step to achieve 0° C.≦(To−Tc)≦5° C., wherein (To−Tc) is the temperature difference between the temperatures at the peripheral and central parts of the substrate heating surface.

2. The manufacturing method of claim 1, wherein the grinding condition is determined such that a temperature variation in the substrate heating surface decreases based on the measurement result of the temperature distribution.

3. The manufacturing method of claim 1, wherein
   the tubular member is ground by a plurality of grinding steps,
   the temperature distribution is measured after each grinding step, and
   the grinding condition is determined from a relation between a grinding amount and temperature distribution change based on the measurement result of the temperature distribution.

4. The manufacturing method of claim 1, wherein an outer surface of the tubular member is ground substantially evenly.

5. The manufacturing method of claim 1, wherein an outer surface of the tubular member is ground unevenly.

6. The manufacturing method of claim 1, wherein the base plate includes at least one of alumina, aluminum nitride, silicon nitride, silicon carbide and sialon.

7. The manufacturing method of claim 6, wherein the tubular member is made of the same material as the base plate.

8. A manufacturing method for a substrate heating device, comprising:
   forming a base plate having a substrate heating surface in which a resistance heating element is buried;
   forming a tubular member;
   joining the tubular member to the base plate;
   measuring temperature distribution in the substrate heating surface by supplying power to the resistance heating element; and
   grinding the tubular member according to a grinding condition based on a measurement result of the temperature distribution,
   wherein the tubular member is ground such that the base plate and the tubular member have a relation of $$10 \leq Ds/t1 \leq 90$$

Ds denotes an external diameter at a junction of the base plate and the tubular member, and
   t1 denotes a thickness of the tubular member after grinding except for a junction region with the base plate.

9. The manufacturing method of claim 8, wherein the grinding condition is determined such that a temperature variation in the substrate heating surface decreases based on the measurement result of the temperature distribution.

10. The manufacturing method of claim 8, wherein
    the tubular member is ground by a plurality of grinding steps,
    the temperature distribution is measured after each grinding step, and
    the grinding condition is determined from a relation between a grinding amount and temperature distribution change based on the measurement result of the temperature distribution.

11. The manufacturing method of claim 8, wherein an outer surface of the tubular member is ground substantially evenly.

12. The manufacturing method of claim 8, wherein an outer surface of the tubular member is ground unevenly.

13. The manufacturing method of claim 8, wherein the base plate includes at least one of alumina, aluminum nitride, silicon nitride, silicon carbide and sialon.

14. The manufacturing method of claim 13, wherein the tubular member is made of the same material as the base plate.

15. A manufacturing method for a substrate heating device, comprising:

forming a base plate having a substrate heating surface in which a resistance heating element is buried;
forming a tubular member;
joining the tubular member to the base plate;
measuring temperature distribution in the substrate heating surface by supplying power to the resistance heating element; and
grinding the tubular member according to a grinding condition based on a measurement result of the temperature distribution,
wherein the tubular member is ground such that a thickness t0 of the tubular member before grinding and a thickness t1 of the tubular member after grinding have a relation of $t0-t1 \leq 4$ mm and $t1 \geq 0.5$ mm.

16. The manufacturing method of claim 15, wherein the grinding condition is determined such that a temperature variation in the substrate heating surface decreases based on the measurement result of the temperature distribution.

17. The manufacturing method of claim 15, wherein
the tubular member is ground by a plurality of grinding steps,
the temperature distribution is measured after each grinding step, and
the grinding condition is determined from a relation between a grinding amount and temperature distribution change based on the measurement result of the temperature distribution.

18. The manufacturing method of claim 15, wherein an outer surface of the tubular member is ground substantially evenly.

19. The manufacturing method of claim 15, wherein an outer surface of the tubular member is ground unevenly.

20. The manufacturing method of claim 15, wherein the base plate includes at least one of alumina, aluminum nitride, silicon nitride, silicon carbide and sialon.

21. The manufacturing method of claim 20, wherein the tubular member is made of the same material as the base plate.

* * * * *